United States Patent
Balid et al.

(10) Patent No.: US 11,946,954 B2
(45) Date of Patent: Apr. 2, 2024

(54) ABSENCE OF VOLTAGE DETECTION DEVICE

(71) Applicant: Panduit Corp., Tinley Park, IL (US)

(72) Inventors: Walid Balid, Orland Park, IL (US); Masud Bolouri-Saransar, Orland Park, IL (US)

( * ) Notice: Subject to any disclaimer, the term of this patent is extended or adjusted under 35 U.S.C. 154(b) by 0 days.

(21) Appl. No.: 17/564,568

(22) Filed: Dec. 29, 2021

(65) Prior Publication Data

US 2022/0120790 A1 Apr. 21, 2022

Related U.S. Application Data

(63) Continuation of application No. 16/847,903, filed on Apr. 14, 2020, now Pat. No. 11,215,646.

(60) Provisional application No. 62/836,931, filed on Apr. 22, 2019.

(51) Int. Cl.
*G01R 15/26* (2006.01)
*G01R 19/155* (2006.01)

(52) U.S. Cl.
CPC .......... *G01R 15/26* (2013.01); *G01R 19/155* (2013.01)

(58) Field of Classification Search
None
See application file for complete search history.

(56) References Cited

U.S. PATENT DOCUMENTS

| | | |
|---|---|---|
| 3,141,128 A | 7/1964 | Behr |
| 3,354,386 A | 11/1967 | Daigle et al. |
| 3,737,765 A | 6/1973 | Lee et al. |
| 3,810,003 A | 5/1974 | Portoulas |
| 3,863,208 A | 1/1975 | Balban |
| 3,912,879 A | 10/1975 | Lawson |
| 4,254,495 A | 3/1981 | Bollard |
| 4,870,343 A | 9/1989 | Dooley et al. |
| 5,245,275 A | 9/1993 | Germer et al. |
| 5,285,163 A | 2/1994 | Liotta |
| 5,353,014 A | 10/1994 | Carroll et al. |
| 5,600,524 A | 2/1997 | Neiger et al. |
| 5,715,125 A | 2/1998 | Neiger et al. |
| 5,814,997 A | 9/1998 | Bouchez |
| 5,867,019 A | 2/1999 | Malenko et al. |
| 5,874,895 A | 2/1999 | Devarney |
| 5,986,557 A | 11/1999 | Clarke |
| 6,008,661 A | 12/1999 | Goodwin |
| 6,075,448 A | 6/2000 | Verkhovskiy |
| 6,100,679 A | 8/2000 | McCasland |
| 6,111,733 A | 8/2000 | Neiger et al. |
| 6,121,779 A | 9/2000 | Schutten et al. |
| 6,157,184 A | 12/2000 | Atherton |

(Continued)

FOREIGN PATENT DOCUMENTS

| | | |
|---|---|---|
| CN | 100504413 C | 6/2009 |
| CN | 106226577 A | 12/2016 |

(Continued)

*Primary Examiner* — Jas A Sanghera

(57) ABSTRACT

A system and method for detecting the connectivity of an absence of voltage detector to the source of power to be detected has a first terminal wire connected to a first terminal and a second terminal wire also connected to the first terminal. An RF signal is placed on the first terminal and then its presence is detected on the second signal wire. This method and system can also be placed on each phase of a three phase system.

1 Claim, 21 Drawing Sheets

System Block Diagram

(56) References Cited

U.S. PATENT DOCUMENTS

| | | |
|---|---|---|
| 6,215,314 B1 | 4/2001 | Frankewich, Jr. |
| 6,313,642 B1 | 11/2001 | Brooks |
| 6,657,837 B1 | 12/2003 | Morris et al. |
| 6,703,948 B1 | 3/2004 | Kupferschmidt et al. |
| 6,988,061 B2 | 1/2006 | Gray et al. |
| 7,154,281 B2 | 12/2006 | Piesinger |
| 7,268,558 B2 | 9/2007 | Mills et al. |
| 8,013,613 B2 | 9/2011 | Allen, Jr. |
| 8,405,404 B2 | 3/2013 | Vanaud |
| 2008/0081516 A1 | 4/2008 | Brandt et al. |
| 2010/0033190 A1 | 2/2010 | Devine |
| 2012/0297263 A1 | 11/2012 | Taya |
| 2013/0214922 A1 | 8/2013 | Clarke |
| 2014/0022022 A1* | 1/2014 | Choy ............... G01R 31/2824 331/57 |
| 2016/0313386 A1* | 10/2016 | Bugaris ............... G01R 31/52 |

FOREIGN PATENT DOCUMENTS

| | | |
|---|---|---|
| EP | 2743712 A1 | 6/2014 |
| FR | 3030137 A1 | 6/2016 |
| JP | S6130874 U1 | 2/1986 |
| JP | H02214892 A | 8/1990 |
| JP | H0651001 A | 2/1994 |
| JP | H0677409 U | 10/1994 |
| JP | 2017528724 A | 9/2017 |
| WO | 8402015 A1 | 5/1984 |
| WO | 2005029101 A2 | 3/2005 |
| WO | 2018148387 A1 | 8/2018 |

* cited by examiner

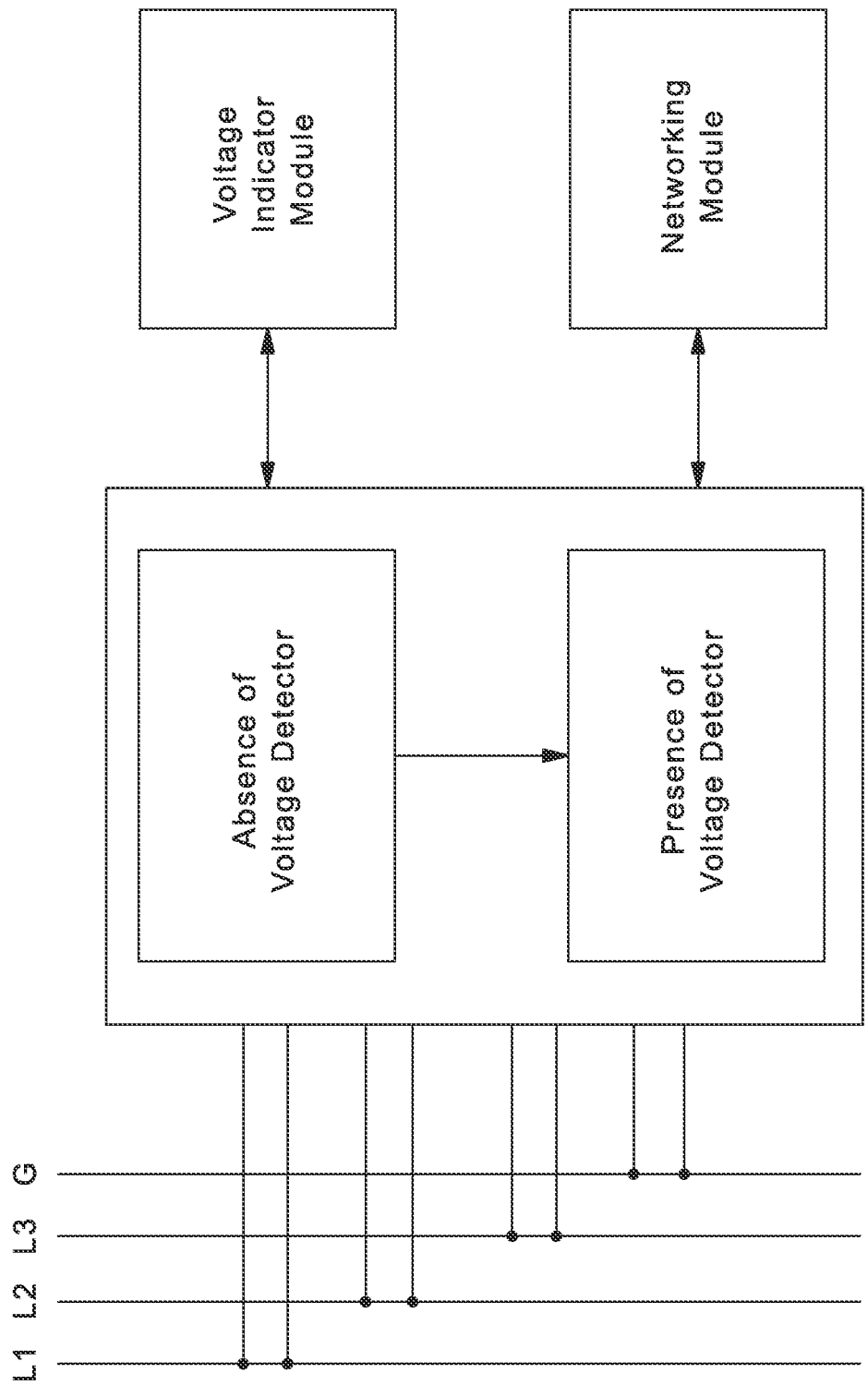

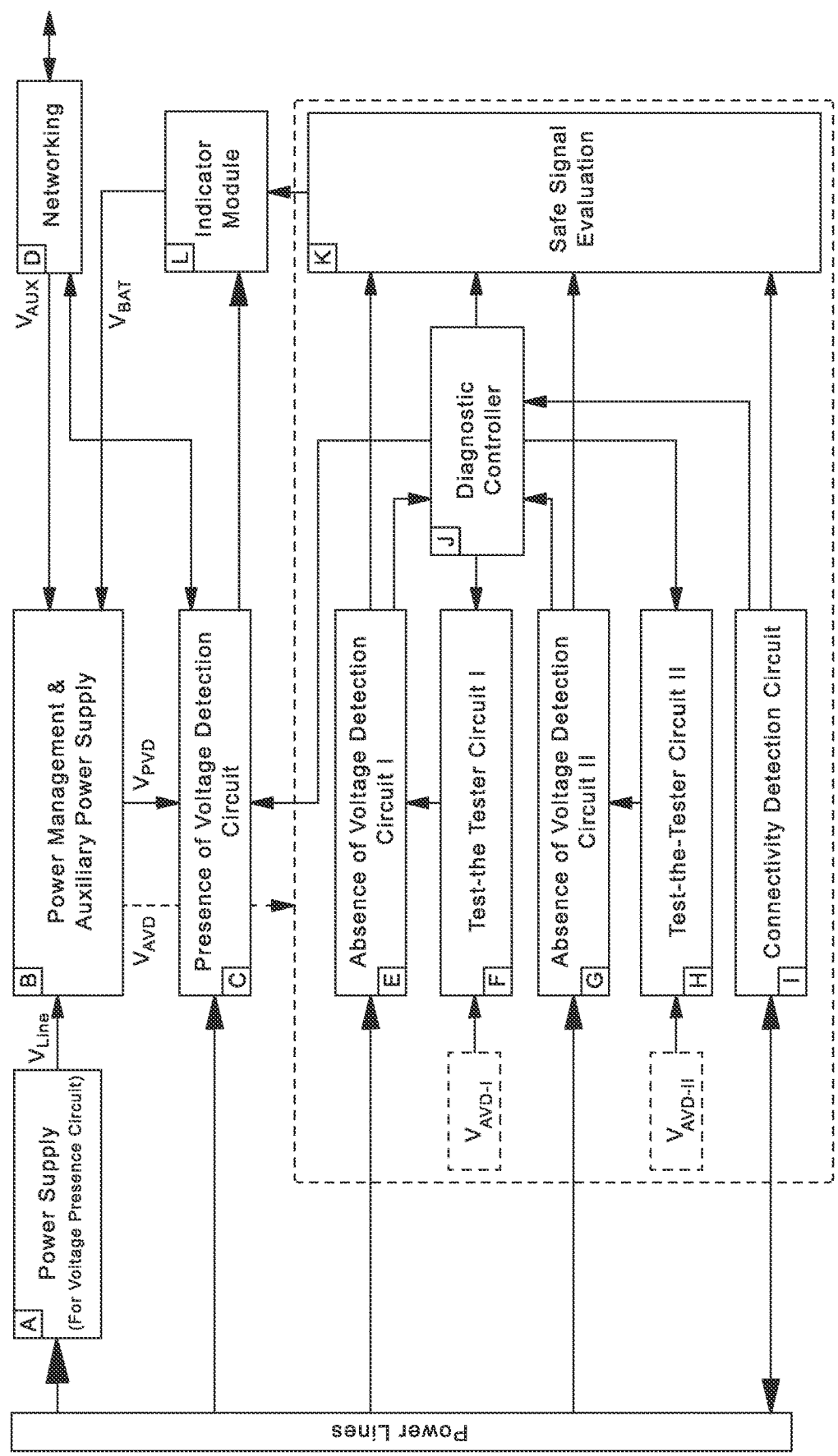

Voltage Presence Circuit Power Supply Block Diagram

PMDU Block Diagram

PVD Block Diagram

PWM Signals generated by the PVD Controller

Networking Interface Block Diagram

AVD-Common Mode (CM)

Fig. 10 AVD-Differential Mode (DM)

Test-the-Tester connects to AVD-Common Mode (CM)

| Sequence | L1 | L2 | L3 | Note | Condition |
|---|---|---|---|---|---|
| 1 | - | - | - | none | PASS |
| 2 | +3.0V | - | - | L1-G | FAIL |
| 3 | -3.0V | - | - | L1-G | FAIL |
| 4 | +1.5V | - | - | L1-G | PASS |
| 7 | -1.5V | - | - | L1-G | PASS |
| 8 | - | +3.0V | - | L2-G | FAIL |
| 5 | - | -3.0V | - | L2-G | FAIL |
| 9 | - | +1.5V | - | L2-G | PASS |
| 10 | - | -1.5V | - | L2-G | PASS |
| 6 | - | - | +3.0V | L3-G | FAIL |
| 11 | - | - | -3.0V | L3-G | FAIL |
| 12 | - | - | +1.5V | L3-G | PASS |
| 13 | - | - | -1.5V | L3-G | PASS |
| 14 | +1.5V | +1.5V | - | L1-L2 | FAIL |
| 15 | -1.5V | -1.5V | - | L1-L2 | FAIL |
| 16 | +1.5V | - | +1.5V | L1-L3 | FAIL |
| 17 | -1.5V | - | -1.5V | L1-L3 | FAIL |
| 18 | - | +1.5V | +1.5V | L2-L3 | FAIL |
| 19 | - | -1.5V | -1.5V | L2-L3 | FAIL |

Generated Reference Voltages and Test Procedure Order Sequence

Fig. 14

Implementing Redundancy in AVD to Validate Decision Outcome

Connectivity Detection-Test Sequencer

| Phase | Cnt Out | RF Generator MUX/Cnt | | RF Detector DEMUX/Cnt | | RF Generation Lines | | | RF Detection Lines | | | RF GEN | Correct OUT |
|---|---|---|---|---|---|---|---|---|---|---|---|---|---|
| | | IN1/Q3 | IN2/Q2 | IN1/Q1 | IN2/Q0 | L1G | L2G | L3G | L1D | L2D | L3D | on/off | |
| - | 0 | 0 | 0 | 0 | 0 | - | - | - | - | - | - | OFF | 0 |
| L1 | 1 | 1 | 0 | 0 | 0 | SEL | - | - | - | - | - | ON | 0 |
| | 2 | 0 | 1 | 0 | 0 | - | SEL | - | - | - | - | ON | 0 |
| | 3 | 1 | 1 | 0 | 0 | - | - | SEL | - | - | - | ON | 0 |
| | 4 | 0 | 0 | 1 | 0 | - | - | - | DET | - | - | OFF | 0 |
| | 5 | 1 | 0 | 1 | 0 | SEL | - | - | DET | - | - | ON | 1 |
| | 6 | 0 | 1 | 1 | 0 | - | SEL | - | DET | - | - | ON | 0 |
| | 7 | 1 | 1 | 1 | 0 | - | - | SEL | DET | - | - | ON | 0 |
| L2 | 8 | 0 | 0 | 0 | 1 | - | - | - | - | DET | - | OFF | 0 |
| | 9 | 1 | 0 | 0 | 1 | SEL | - | - | - | DET | - | ON | 0 |
| | 10 | 0 | 1 | 0 | 1 | - | SEL | - | - | DET | - | ON | 1 |
| | 11 | 1 | 1 | 0 | 1 | - | - | SEL | - | DET | - | ON | 0 |
| L3 | 12 | 0 | 0 | 1 | 1 | - | - | - | - | - | DET | OFF | 0 |
| | 13 | 1 | 0 | 1 | 1 | SEL | - | - | - | - | DET | ON | 0 |
| | 14 | 0 | 1 | 1 | 1 | - | SEL | - | - | - | DET | ON | 0 |
| | 15 | 1 | 1 | 1 | 1 | - | - | SEL | - | - | DET | ON | 1 |

Connectivity Detection-Tests Sequence and Expected Outcome

Fig. 18

Signal Evaluation and Decision Circuit Block Diagram

ABSENCE OF VOLTAGE DETECTION DEVICE

CROSS REFERENCE TO RELATED APPLICATIONS

This application is a continuation of U.S. patent application Ser. No. 16/847,903, filed Apr. 14, 2020, which issued as U.S. Pat. No. 11,215,646, on Jan. 4, 2022, which claims priority to U.S. Provisional Application Ser. No. 62/836,931, filed Apr. 22, 2019, the subject matter of which is hereby incorporated by reference in its entirety.

BACKGROUND

The present invention describes a novel system and method of providing a reliable indication and verification of the presence and absence of voltage in electrical equipment using a permanently installed voltage tester that will indicate whether the equipment is in an electrically safe state without direct access to the equipment. Accomplishing reliable verification of the absence of voltage before accessing electrical equipment greatly enhances safety in several ways. It prevents the person interacting with the equipment from inadvertently contacting an unintended part of the circuit or shorting conductors if the equipment is in fact energized. It also increases the distance between the person and the potentially energized conductive parts as well as possibly containing any resulting effects should an arc flash occur.

SUMMARY

A system and method for detecting the connectivity of an absence of voltage detector to the source of power to be detected has a first terminal wire connected to a first terminal and a second terminal wire also connected to the first terminal. An RF signal is placed on the first terminal and then its presence is detected on the second signal wire. This method and system can also be placed on each phase of a three phase system.

BRIEF DESCRIPTION OF THE FIGURES

FIG. 1 shows an overall block system diagram of an absence of voltage detector.

FIG. 3 illustrates the system architecture of the absence of voltage detector of FIG. 1.

FIG. 14 shows the pre-defined test order of the self-diagnostic procedure and the expected validation response by the absence of voltage detector unit.

FIG. 18 is a chart showing the expected test sequence and outcome of the connectivity system testing.

DETAILED DESCRIPTION OF THE INVENTION

FIG. 1 illustrates the overall system block diagram. The system has a absence of voltage detector, a presence of voltage detector, a voltage indicator module, and a networking module 400. The system implements voltage presence detection techniques that measure the power lines voltage and leverages existing voltage indicator technology to indicate the presence of voltage in a single- or multi-phase power line AC/DC systems. If the power line voltage is approximately 40V, the system will indicate the presence of voltage via an indicator module that is mounted on the safe and isolated side of the equipment/panel. Typically, one or more Red LEDs are illuminated depending on the number of power lines (Single Phase or Multi-Phase) and the application (AC/DC). The indicator module serves as a warning that hazardous voltage is present. If no hazardous voltage presence detected and the indicator is not illuminated, the absence of voltage verification process can be initiated by a button in the indicator module to determine and prove that voltage is absent.

Figure 2A:
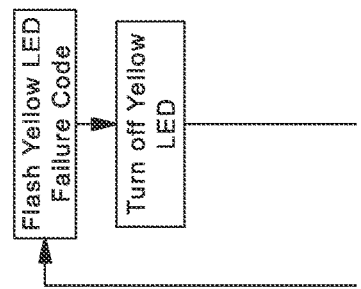
FIG. 2a is a first part of a flow chart showing the steps used by the absence of voltage detector of FIG. 1 in determining the presence or absence of voltage.
Figure 2A:
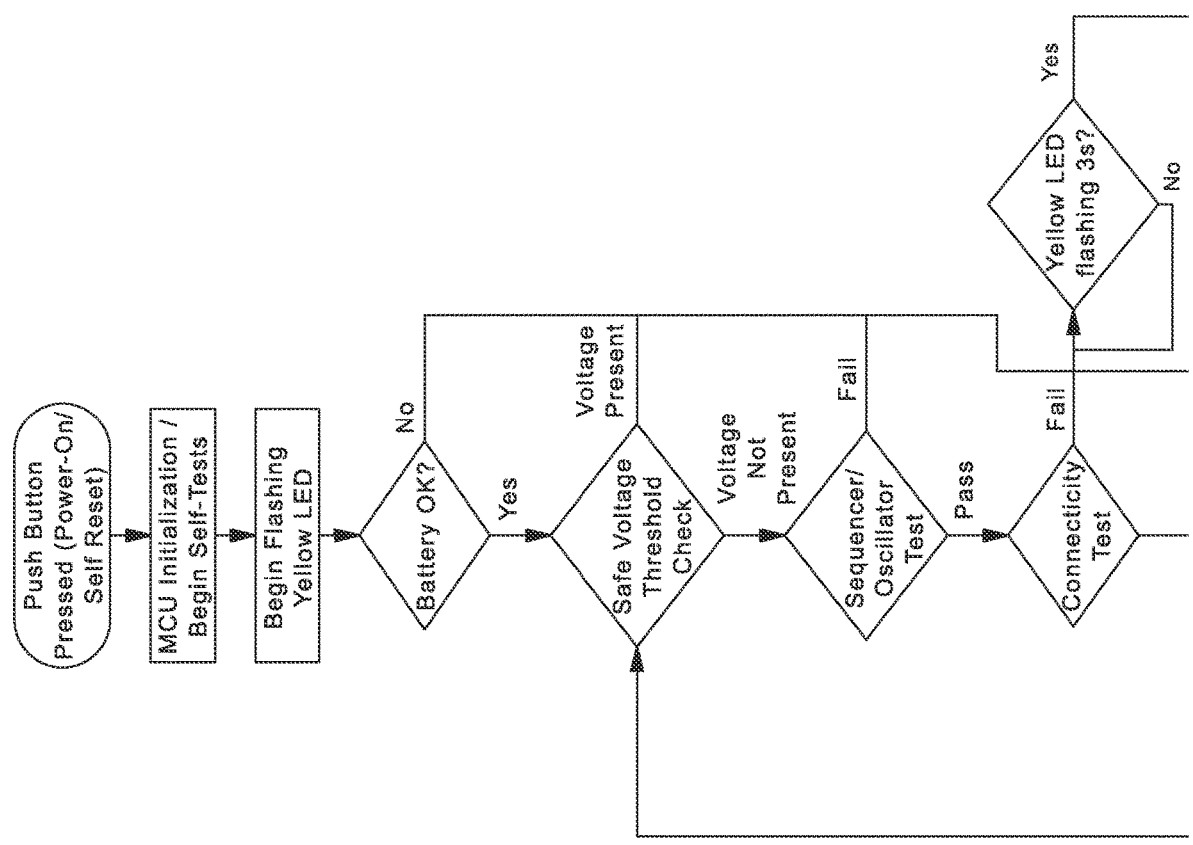
Figure 2B:
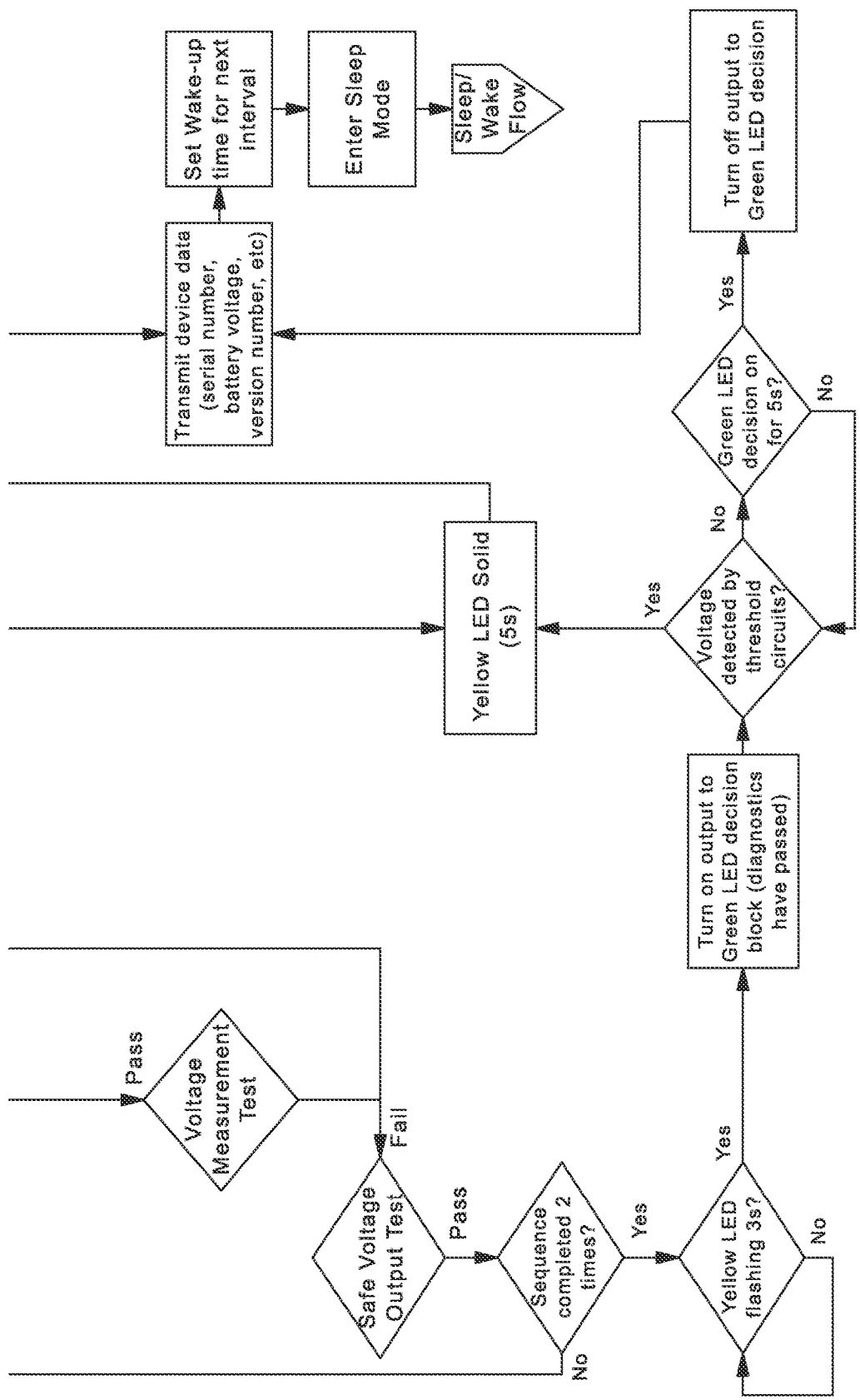
FIG. 2b is the second part of the flow chart of FIG. 2a showing the steps used by the absence of voltage detector of FIG. 1 in determining the presence or absence of voltage.

The absence of voltage detection circuit requires a secondary power source (battery) that is totally independent from the primary power source used in the presence of voltage monitoring circuit. It also requires performing a very critical procedure to prevent catastrophic false indication of the absence of voltage by verifying that the connectivity between installed voltage detection device and monitored equipment, and that the absence of voltage indication based on A.V. on the primary side and not because of an installation failure. The absence of voltage is verified afterwards through a detection scheme that employs direct measurements of primary voltage and the voltage level is below a pre-defined de-energization level (i.e., ±3V). FIGS. 2a and 2b depicts the detailed Absence of Voltage Verification Procedure.

The procedure also employs a series of self-diagnostics to verify that the voltage detection device is fully functional and indeed working as expected, and it doesn't have an internal failure that can trigger a false outcome under any of the testing conditions. To increase confidence in the absence of voltage detection outcome used to verify a safe state, redundant circuitry was employed for both the absence of voltage detector and tester self-diagnostic circuits. If the criteria for each step in both redundant Channels in the process are satisfied, it can then be concluded that the absence of voltage has been verified and the equipment being monitored in in a safe state.

FIG. 3 illustrates the system architecture of the presence and absence of voltage detector. The system is mainly composed of the following sub-systems and modules:

A. Ultra-wide Input Range Isolated Power Supply
B. System Power Management and Distribution
C. Presence of Voltage Detector
D. Networking Interface
E. Absence of Voltage Detector I
F. System Self-diagnostic Circuit I
G. Absence of Voltage Detector II
H. System Self-diagnostic Circuit II
I. Connectivity Detector
J. System Diagnostic Controller
K. Signal Evaluation and Decision Circuit
L. Indicator Module The following sections provide detailed description for each of the above sub-systems.

Ultra-wide Input Range Isolated Power Supply

Figure 4:
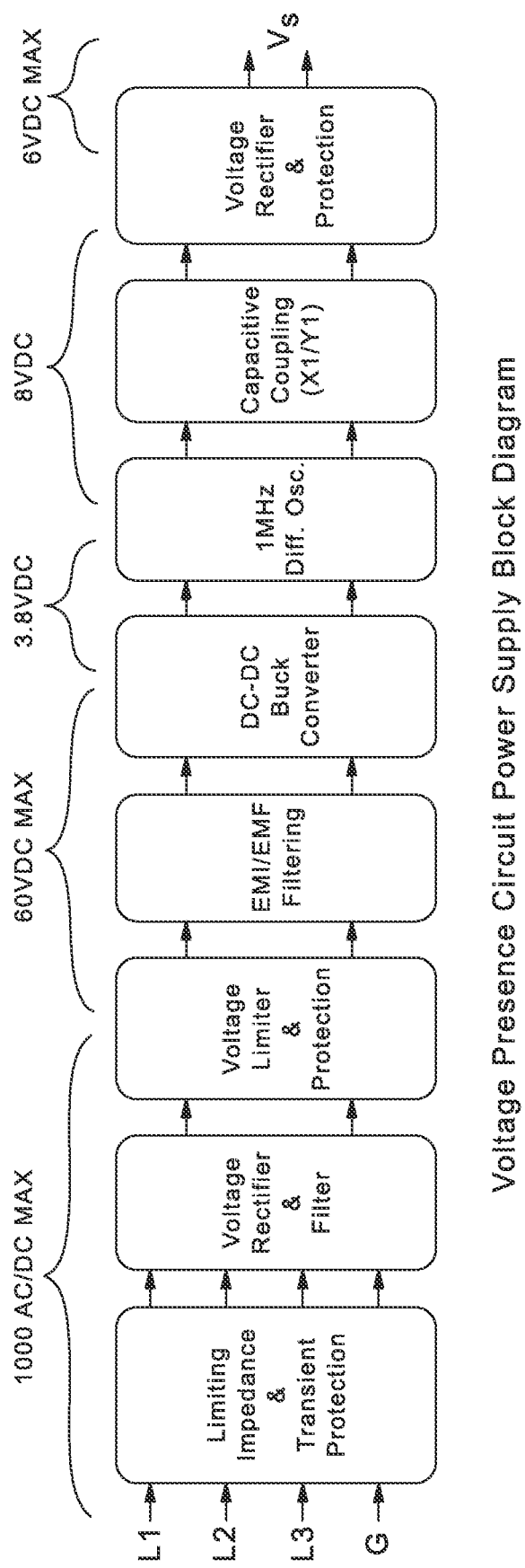
FIG. 4 shows the power supply block diagram of the absence of voltage detector of FIG. 1.

FIG. 4 illustrates the isolated power supply (IPS) block diagram. The IPS 500 is utilized to power up the voltage presence indication circuit from power lines in both AC and DC power systems. The supported voltage range is 0~1 KV AC/DC. The IPS implements a limiting impedance resistor network and transient protection 510 limit the input power to 15 W at 110% of the maximum input voltage under single fault condition (e.g., the input is shorted) to meet the functional safety requirements defined in UL 1436. The resistor networks are composed of a chain of 8 Metal Film High Power Resistors that have 500V/2W rating. Equation 1 and 2 define the total impedance and power dissipation under single fault condition and 110% of the maximum input voltage.

FIG. 4 Voltage Presence Circuit Power Supply Block Diagram $$R_{total} = \frac{V^2}{P} = \frac{1100^2}{15} = 80.666 \text{ K}\Omega \qquad \text{Eq. 1}$$

$$P_R = \frac{V_R^2}{R} \approx \frac{\left(\frac{1100}{8}\right)^2}{10 \times 10^3} = 1.89 \text{ W} \qquad \text{Eq. 2}$$

A transient protection was implemented into the IPS to allow protection from lightning, inductive load switching, electrostatic discharge (ESD) and electrical fast transient (EFT). A voltage rectifier was implemented to support both AC and DC power systems and provide reverse-polarity protection in case of DC power system. Since the input voltage is ultra-wide (i.e., 0 to 1000V), a low-loss voltage reduction circuit with over-voltage protection was implemented to limit the voltage at the output of this stage to 58V when the power lines voltage exceeds this limit. The voltage reduction circuit is mainly composed of two high voltage power MOSFET transistors, two transient voltage suppressors (TVS), and a high voltage resistors string. Another layer of protection was integrated to prevent the voltage from exceeding 60V at the output of this stage in case of components failure. Electromagnetic interference (EMI) Pi Balanced Filter was employed to minimize the effect of differential mode EMI switching noise induced by the frequency harmonics generated by the DC-DC synchronous buck converter in the following stage. The Buck Converter features ultra-low IQ and pulse frequency modulation (PFM) scheme that allow the power circuit to operate at very low input voltage (typically, 50V) when the energy at the converter input is very limited due to the 82 KΩ limiting impedance network and other limiting circuitries in front of the DC-DC buck converter. The PFM mode allows optimal light-load efficiency. An Under-voltage-Lockout (UVLO) was set to activate and deactivate the DC-DC internal switching circuit at 11V and 9V, respectively. This allows the output capacitors to charge up and turn the voltage indication LEDs under a low input voltage condition that is as low as 30V. The voltage at the DC-DC converter output is regulated at 3.8V and used to power up the frequency synthesizer that generates the oscillation frequency for the isolation barrier of the IPS. The frequency synthesizer is a dual-output, symmetrical cross-coupled sine-wave oscillator with a controlled output impedance. The synthesizer generates up to 1 MHz differential sinusoidal waveforms that are 180° phase shifted to the isolation barrier that is composed of X1Y1 capacitors, rated at 760 VAC/1500 VDC, which form differential capacitive coupling with 8 KV enforced isolation between primary and secondary circuits. The differential output voltage at the capacitors output rectified using ultra-low forward voltage diodes that form a full bridge. The diodes bridge output is managed by the system power management and distribution unit (see block B on FIG. 3.

System Power Management and Distribution

Figure 5:
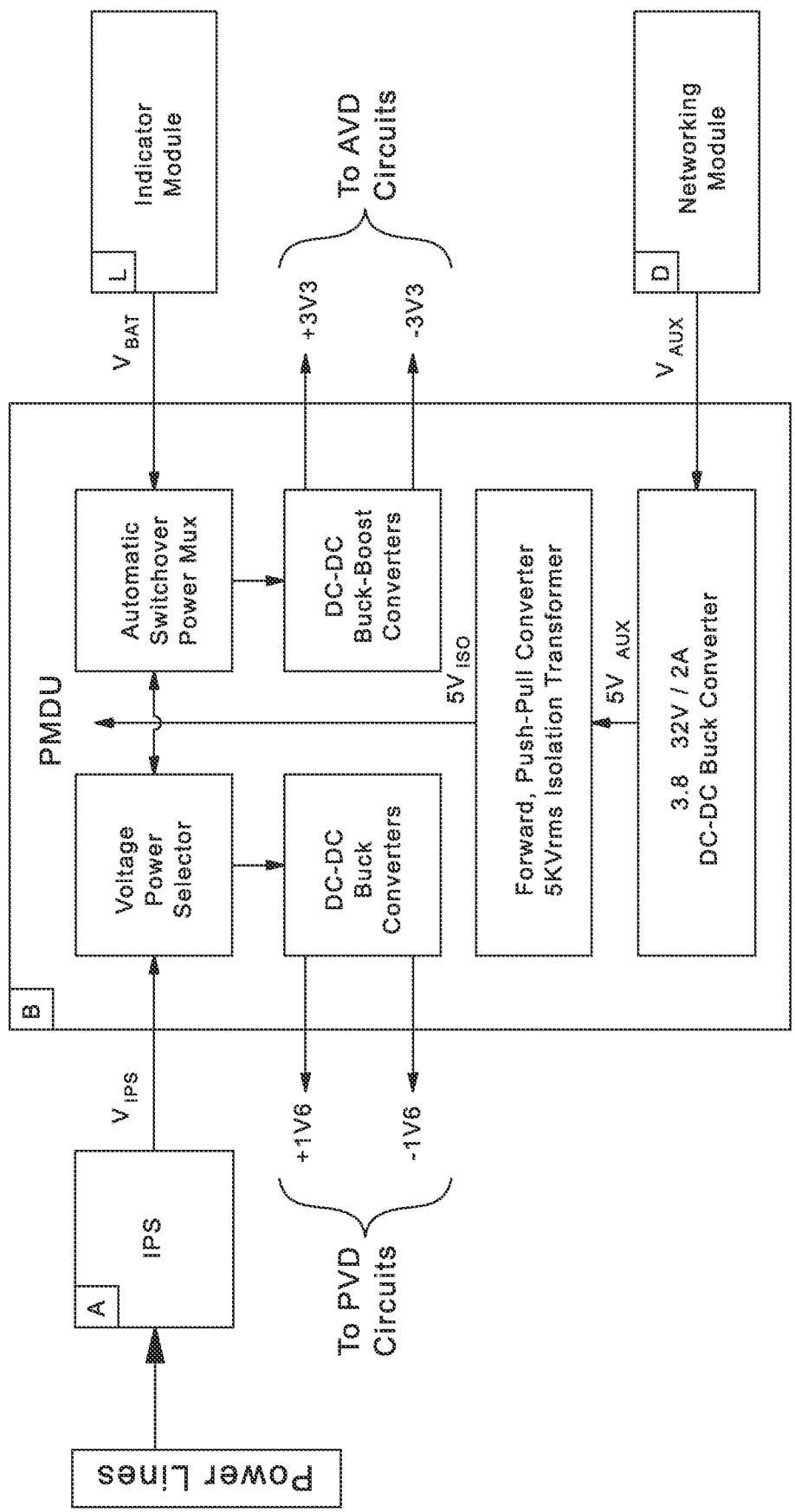
FIG. 5 shows a block diagram of the power management and system unit of the absence of voltage detector of FIG. 1.

The system power management and distribution unit (PMDU) converts, isolates, and regulates various supply voltages used in each sub-system. It also controls the priority between IPS and isolated Auxiliary Power Supply (AUX) used to supply the Presence of Voltage detector (PVD) circuits, as well as the priority between the Secondary Power Supply (BAT) and the isolated AUX used to supply the Absence of Voltage detector (AVD) circuits. FIG. 5 depicts the PMDU block diagram:

The AUX is a kind of backup power and can be supplied to the system throughout the networking interface. The system was designed to communicate with external modules over isolated RS-485 interface with power integrated over the same twisted pair—Power-over-RS485. The interface also supports external 12~24V DC power adapter connected to the same RS485 interface connector. The RS485 interface employs differential capacitive coupling to isolate power and pass data in addition to differential LC filter to pass power and isolate data. The power afterword is rectified to protect the system from inverse-polarity on the RS485 bus before it gets forwarded into DC-DC buck converter that convert the voltage distributed over the RS485 bus, typically 12V or 24V DC, to 5V DC output. The AUX voltage isolation circuit employs 160 KHz low-noise, Push-Pull transformer driver in addition to isolation transformer that has 5 KVrms reinforced isolation. The output of the transformer is 5V isolated AUX.

The 5V isolated AUX is distributed into two independent automatic switchover power multiplexers. The first power MUX switchover between the IPS and Isolated AUX with priority to AUX over IPS. The output of the switch goes into DC-DC buck converter to generate ±1V6 that power up the PVD circuits. The second power MUX switchover between the BAT and Isolated AUX with priority to BAT over AUX.

The output of the switch goes into DC-DC buck-boost converter to generate ±3V3 that power up the AVD circuits.

Presence of Voltage Detector

Figure 6:
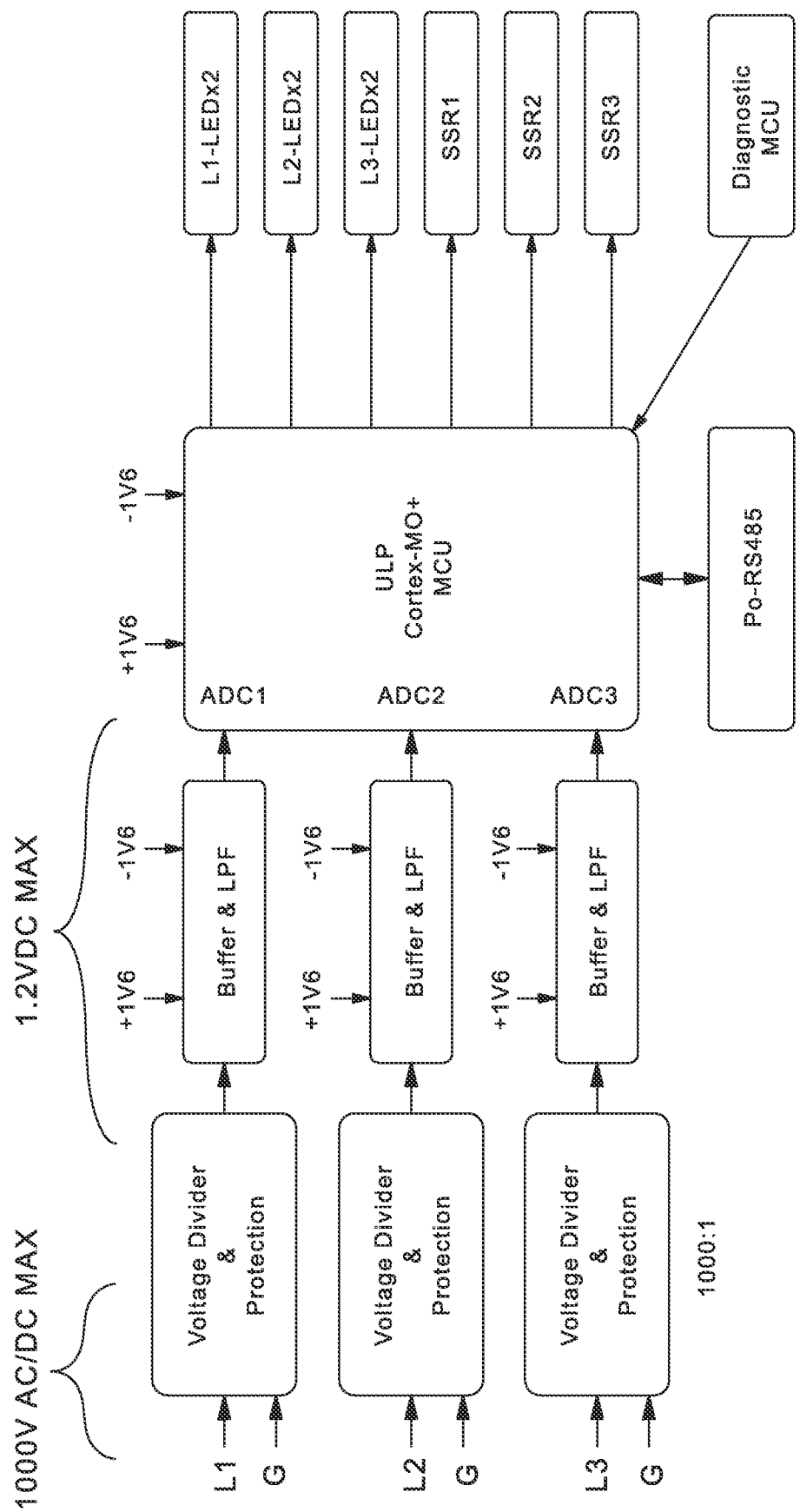
FIG. 6 shows a block diagram of the presence of voltage unit of the absence of voltage detector of FIG. 1.

The PVD circuit block diagram is depicted in FIG. 6. It implements resistive isolation (high-impedance) technique between primary line voltage and voltage detection circuitry. A chain of six resistors, 750 KΩ each, were used to reduce the physical size of a single resistor, distribute power consumption, and cover single fault condition such that one resistor failed short. The resistors chain forms a voltage divider that uses Ohm's Law and has a ratio set to 1000:1.5 with 1% tolerance such that the maximum sensed voltage at the voltage divider output is non-hazardous and within the operating range of the sensing circuit components. The dynamic range is defined by the following boundaries:
- For maximum line voltage of 1000V, the voltage divider output is at 1.5V
- For minimum line voltage of 1V, the voltage divider output is at 1.5 mV An ultra-low capacitance, low clamping voltage ESD protection diodes were also integrated at the voltage divider output to provide another layer of protection from ESD (IEC 61000-4-2), EFT (IEC 61000-4-4), and surges (IEC 61000-4-5). The protected outputs connect to a Nano-power, rail-to-rail input and output op-amp that is used as signal conditioner/isolator between the voltage divider mega-ohm impedance and the Analog to Digital Converter (ADC) input impedance. A low-pass filter was employed after the op-amp and connect to the 12-bit ADC input on the PVD ultra-low power controller. The 12-bit ADC provides 244 μV resolution, which is enough for 163 mV measurement accuracy on the input voltage from primary side.

In general, only one indicator module is used for each voltage detector. The system also supports a secondary indicator module, which adds three more phase indication LEDs to be illuminated from the IPS. The PVD phase indicators (L1, L2, and L3) typically start illuminating in the presence of a voltage that is considered non-hazardous (typically 30~50V). At this low voltage, the available energy at ISP side is very limited (in the rate of microamp) due to the limiting impedance at the primary side. Illuminating all six LEDs requires 4.5 mW when the available energy at 40V is less than 4 mW only. The 4 mW energy supplies all the PVD circuitry in addition to the phase indication LEDs.

Figure 7:
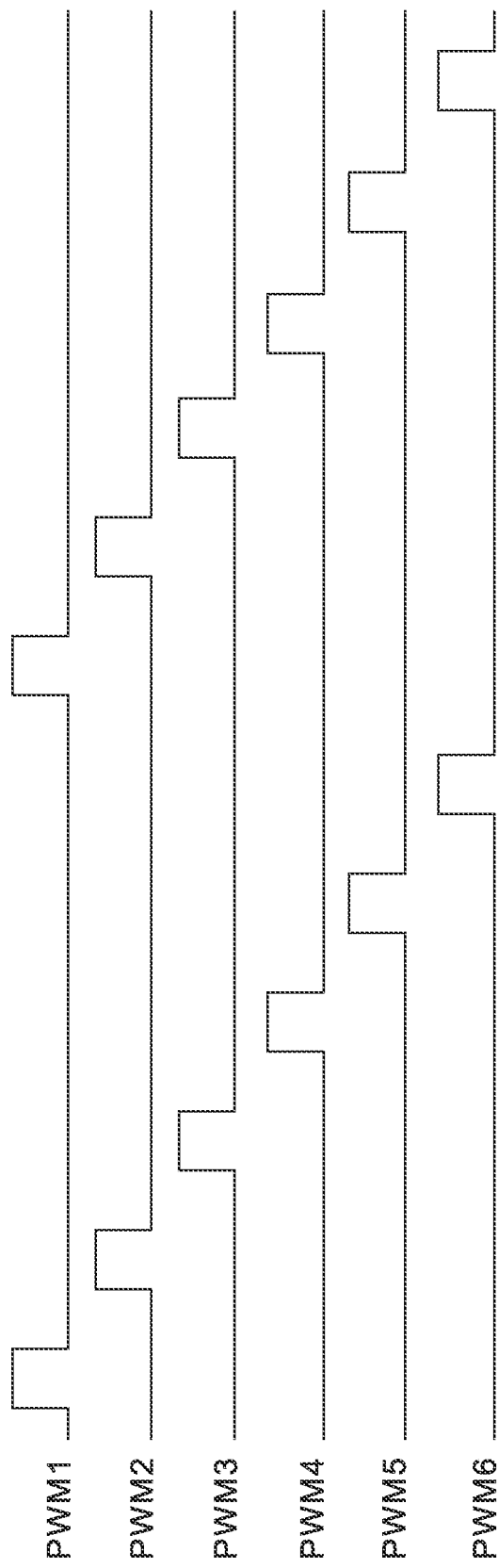
FIG. 7 shows the pulse wave modulated signals generated by the presence of voltage unit controller.

In order to conserve some energy, the ultra-low-power controller first measures the voltage on all three phases. If the voltage exceeds a pre-defined threshold, the controller alternates activation cycle of the LEDs—only the ones with line voltage exceeded the threshold—such that only one LED is active at a time. This was achieved by generating 1 KHz pulse modulated signals (PWM) with 16% duty-cycle as illustrated in FIG. 7. This allowed to conserve more than 50% of the energy when turning all six LEDs.

Networking Interface

Several industrial applications require the distribution of both data and power between master and remote units. As the distance between units increases, the cost of cabling tends to become prohibitive. By combining power and data communication onto a common single pair of wires the cabling numbers, size, and weight can be significantly reduced provide significant system cost savings. This also can help when new devices are placed in locations with limited power access.

Figure 8:
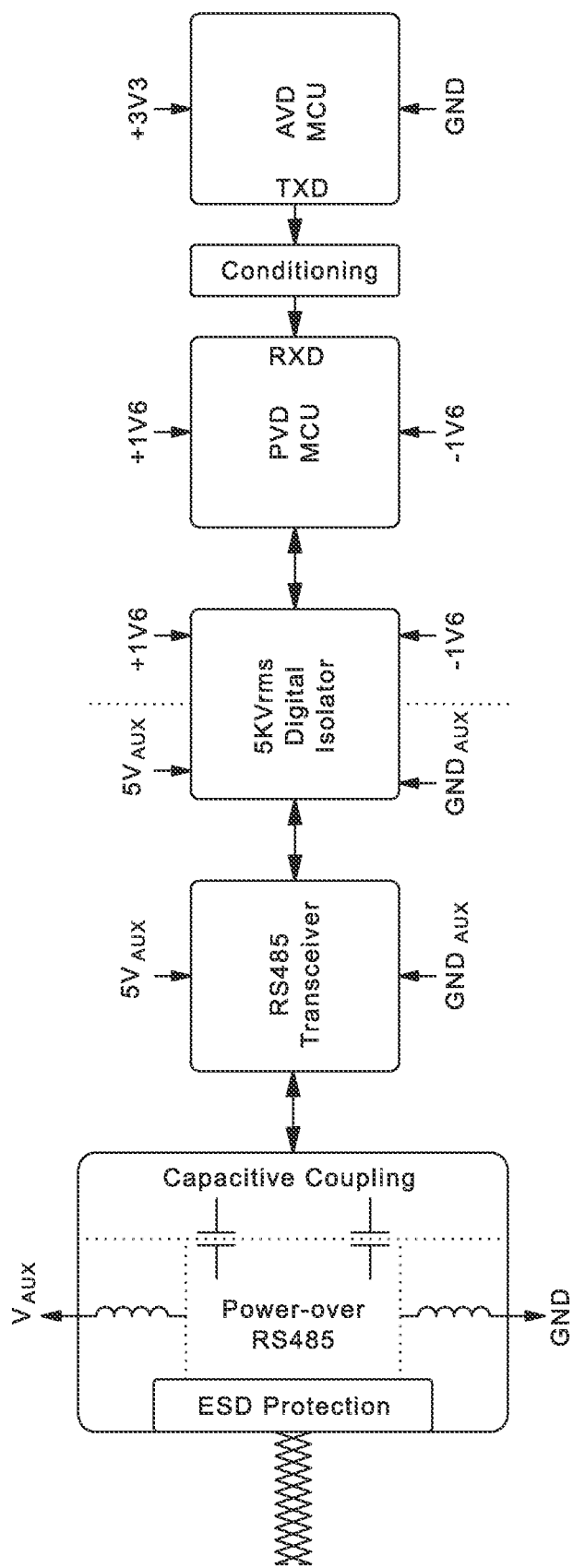
FIG. 8 shows the networking interface block diagram og the absence of voltage detector of FIG. 1.

The networking interface block diagram is illustrated in FIG. 8. The design uses a bias-tee structure to combine power and data. DC power is injected into the twisted pair cable by a master unit throughout a power injector with a proper filtering. A power extractor on the networking interface—composed of two power inductors, filtering, and bridge rectifier—extracts the power from the bus and block the data from passing into the internal supply. The DC power return path run through the same differential twisted pair. If L1 and L2 provide sufficiently high impedance, they appear as an open circuit to the high frequency signals, and do not affect signal fidelity. Because the DC power and return path can runs through the two wires of the differential pair, any switching noise from the power supply may appear differentially and superimposed onto the high-speed differential signals. For this reason, it's crucial to design the power supply to have ultra-low noise and use noise reduction circuits to minimize the noise to prevent any performance degradation due to the potential for signal-to-noise erosion. It's also critical for the inductors to have high self-resonance frequency (10 times the data-rate) and high saturation current.

The capacitive coupling stage is composed of series capacitance that forms a single-pole, high-pass filter, which is set such that the lowest signal frequency is higher than the filter cut-off frequency. The capacitors allow data to pass through while blocking the DC potentials on the bus to protect the transceiver. The inductors were selected according to a pre-defined high-frequency signal such that when transferring data, the inductors will act as a very high impedance towards the data signal on the bus. Manchester encoding was implemented to eliminate the DC portions of a data signal by equalizing the number of zeros and ones within each byte of data on the bus.

The coupled data connects directly to high-speed RS-485 Transceiver, which is supplied directly from the extracted and regulated power on the bus. The transceiver interfaces with the PVD controller throughout a triple-channel digital isolator that provides 5 KVrms reinforced isolation and EMC protection. The AVD controller connects with PVD over one-way communication interface such that only AVD can send data to PVD for functional safety reason. The data could include the internal voltage, temperature, self-diagnostic outcome, connectivity failure code, etc. The PVD communicates throughout the networking interface to receive data commands or send the AVD data as well as information about the line voltages, frequency, phase shift and phase balance. Because the AVD and PVD controller circuits use different voltage levels, a voltage conditioning circuit was implemented to translate the signal voltage level from 3.3V to ±1.6V.

Absence of Voltage Detector I

Conveying absence of voltage status that is directly related to functional safety applications can be a dangerous assumption. Therefore, the AVD must provide positive and reliable verification in which the voltage detector seeks to ensure that all results are in a fail-safe condition. Although, PVD may provide an indication of voltage presence at non-hazardous voltage (40~50V), it can't be utilized for verifying that the device is de-energized and safe to access. Additionally, the AVD must function reliably over the entire range of voltages that the device may be exposed to in the installation, which is 0~1000V AC/DC for the system described in this RS.

Figure 9:
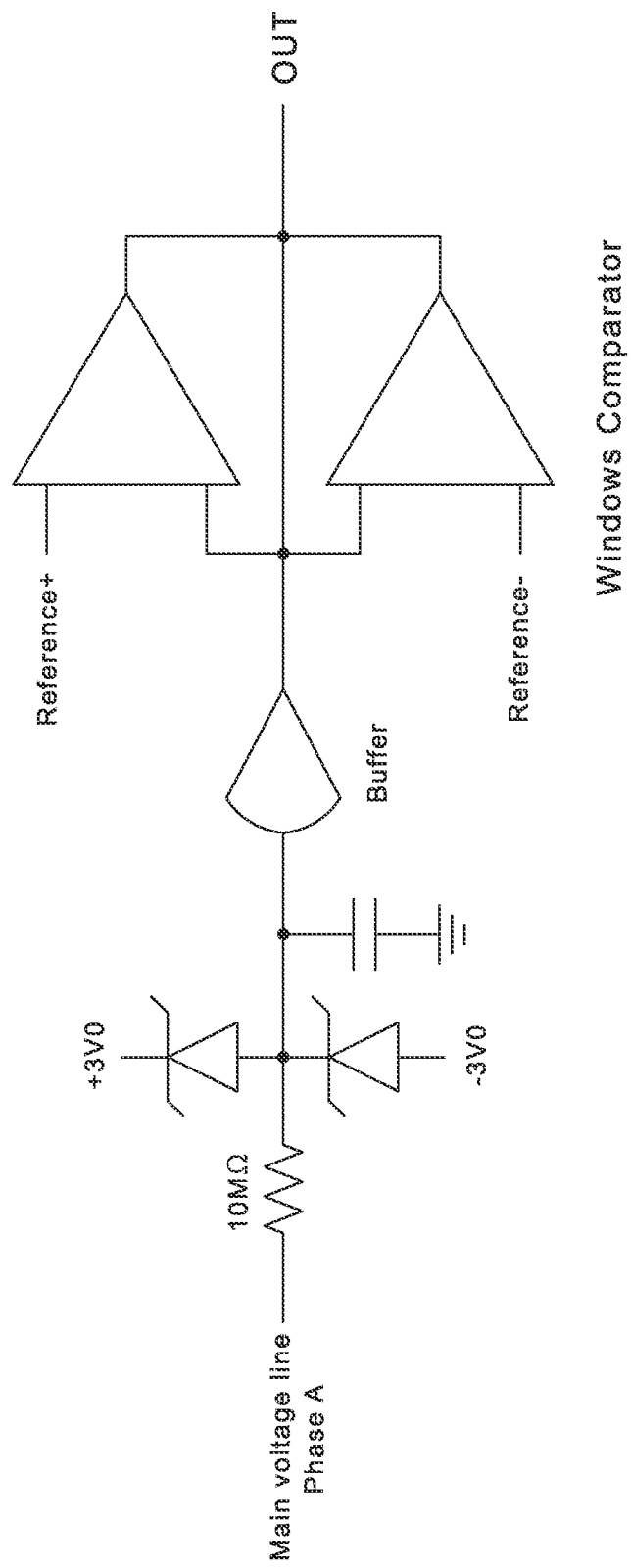
FIG. 9 is a schematic for the common mode absence of voltage detector unit.
Figure 10:
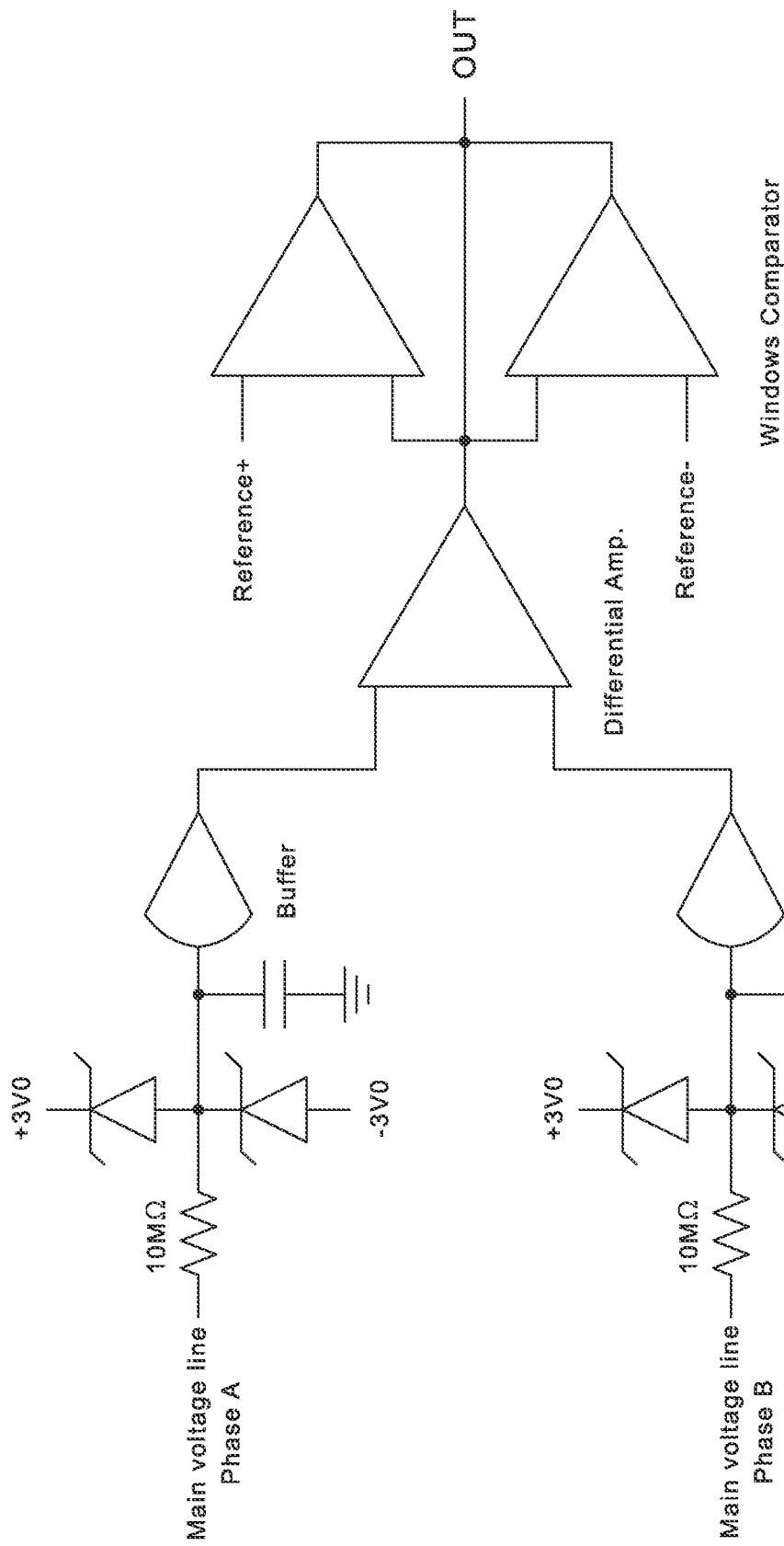
FIG. 10 is a schematic for the differential mode absence of voltage detector unit.

The AVD circuit architecture is depicted in FIGS. 9 and 10. The input buffer connects with power lines throughout a high voltage resistor string that provides high impedance between primary and secondary sides. A chain of six resistors, 1.26 MΩ each and 10 MΩ total, were used to reduce the physical size of a single resistor, distribute power consumption, and cover single fault condition such that one resistor failed short. A rail-to-rail input and output op-amp was used as a buffer/signal-conditioner between the high impedance resistors chain and a window comparator. To limit the voltage on the buffer's input and protect the circuit from any voltages outside the specified working voltage, an ultra-low forward-voltage and leakage-current Schottky diodes were employed. The diodes limit the input voltage to ±3V, which was considered as a hazardous voltage in functional safety terms. A ceramic capacitor at the buffer's input was used to convert the peak voltage to RMS. The buffer output connects to a window comparator, which detects input voltage levels that are within a specific window of voltages. The window boundaries were set to "Reference=±2.95V". Any voltage outside the ±2.95V boundaries is considered hazardous voltage.

The AVD circuits check for both common mode (illustrated in FIG. 9) and differential mode (illustrated in FIG. 10). The CM circuits include three window comparators to check the voltage level on each phase (L1, L2, and L3) relatively to ground. The DM circuits also include three window comparators in addition to three differential amplifiers to check between the three phases relatively to each other's (L1-L2, L1-L3, and L2-L3). All window comparators have open-drain output, which will be active-low if any of the phases presents a voltage level outside the non-hazardous boundaries.

System Self-diagnostic Circuit I

Figure 11:
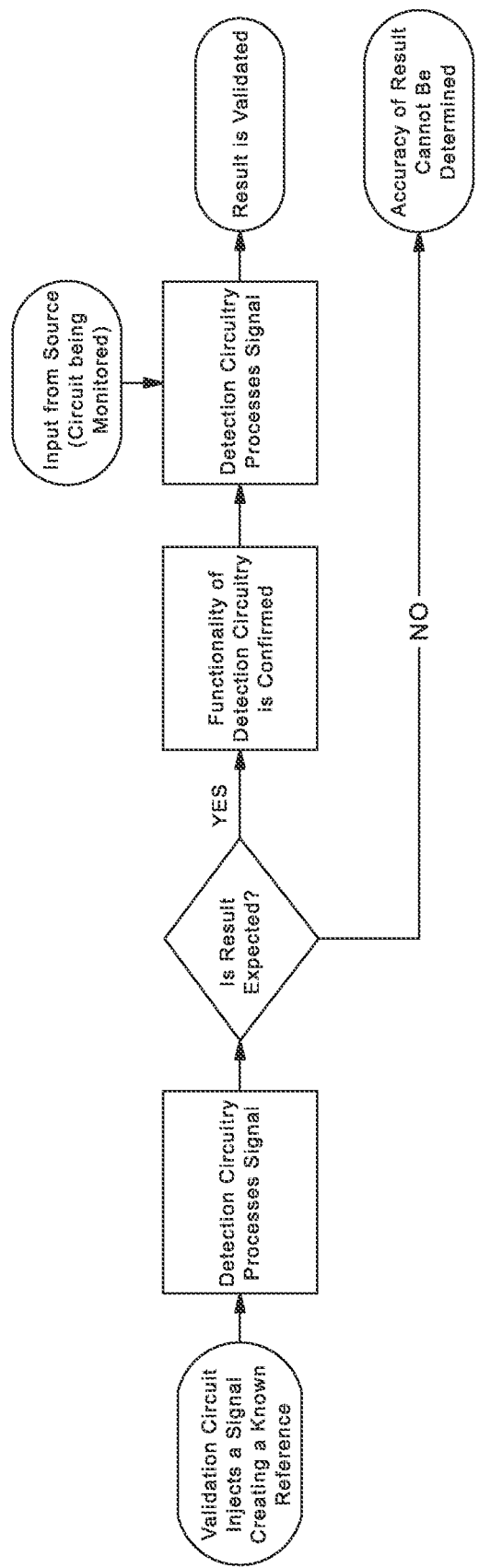
FIG. 11 is a flow chart of the "test-the tester" procedure.

When designing functional safety applications, it becomes crucial to ensure the validity of the result to be provided in a fail-safe manner and possibly be tolerant to certain types of faults or conditions. A self-diagnostics procedure can be implemented as a validation method. The Self-diagnostic procedure can be thought of as "Test-the-Tester", in which a series of checks and verifications (see FIG. 11) are executed to ensure that all critical components, circuits, or processes are operational and performing as expected—both prior to and after the point in the process when the decision outcome is confirmed (e.g., absence of voltage safe state indication). Additionally, this procedure helps ensuring that the functionality of the system was not adversely impacted by any undesirable factors that could be present in the environment where the tester has been installed (e.g., extreme temperatures, aging, noise, static discharge, etc.). Therefore, confirming the functionality of the system is essential in adding confidence to and ensuring the validity of the result.

Figure 12:
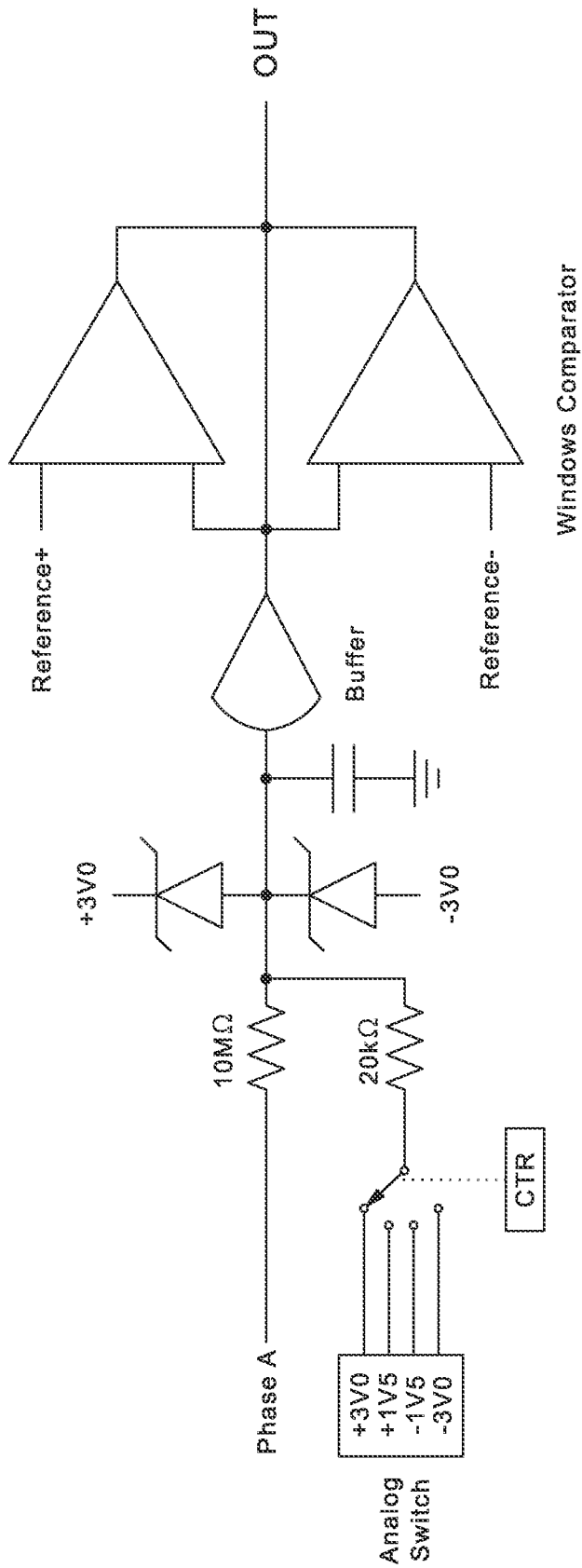
FIG. 12 shows the "test-the-tester" unit connected to the common mode absence of voltage detector unit.
Figure 13:
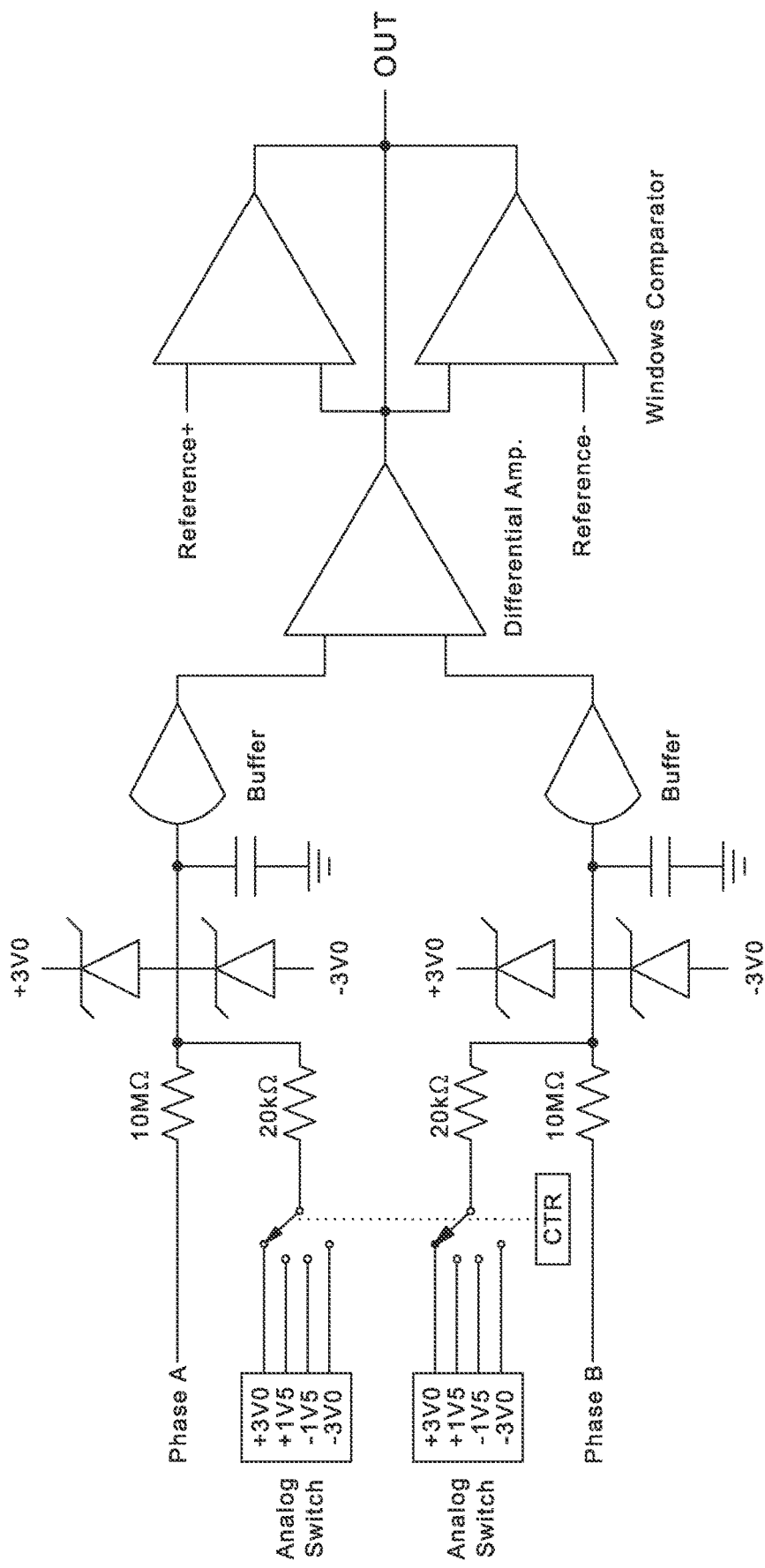
FIG. 13 shows the "test-the-tester" unit connected to the differential mode "test-the-tester" unit.

The self-diagnostic procedure was executed by generating and injecting several known outward-bound reference singles/voltages onto the power lines in a pre-defined order. The reference signals conform with the non-hazardous, as well as, the hazardous boundaries defined by the functional safety standard for AVD. Namely, any voltage level from ±3V was considered hazardous. Moreover, the reference signals were generated from a derived source that is independent of the source being monitored. The injection point relates to the high impedance side of power lines throughout an ultra-low leakage current analog switches that are directly controlled by the diagnostic controller. If the AVD correctly detect the states (safe or unsafe) of generated signals, it confirms that the AVD circuit is operational and performing as expected. The technique described herein can be applied to DC power systems, as well as, single- or multi-phase AC power systems. FIGS. 12 and 13 illustrate the reference signal injection circuitry and its connection with the AVD circuit input. FIG. 14 shows the pre-defined test order of the self-diagnostic procedure and the expected validation response (Condition) by the AVD.

Absence of Voltage Detector II

Redundancy is another verification method that helps in increasing the confidence level in the system's decision outcome and ensuring the validity of the result to be provided in fail-safe manner. Redundancy employs adding at least another sub-system, usually referred as a Channel, that is fully identical in the design and completely independent in the functional execution. The likelihood of both independent Channels failing in the same manner at the same time is relatively very slim.

Figure 15:
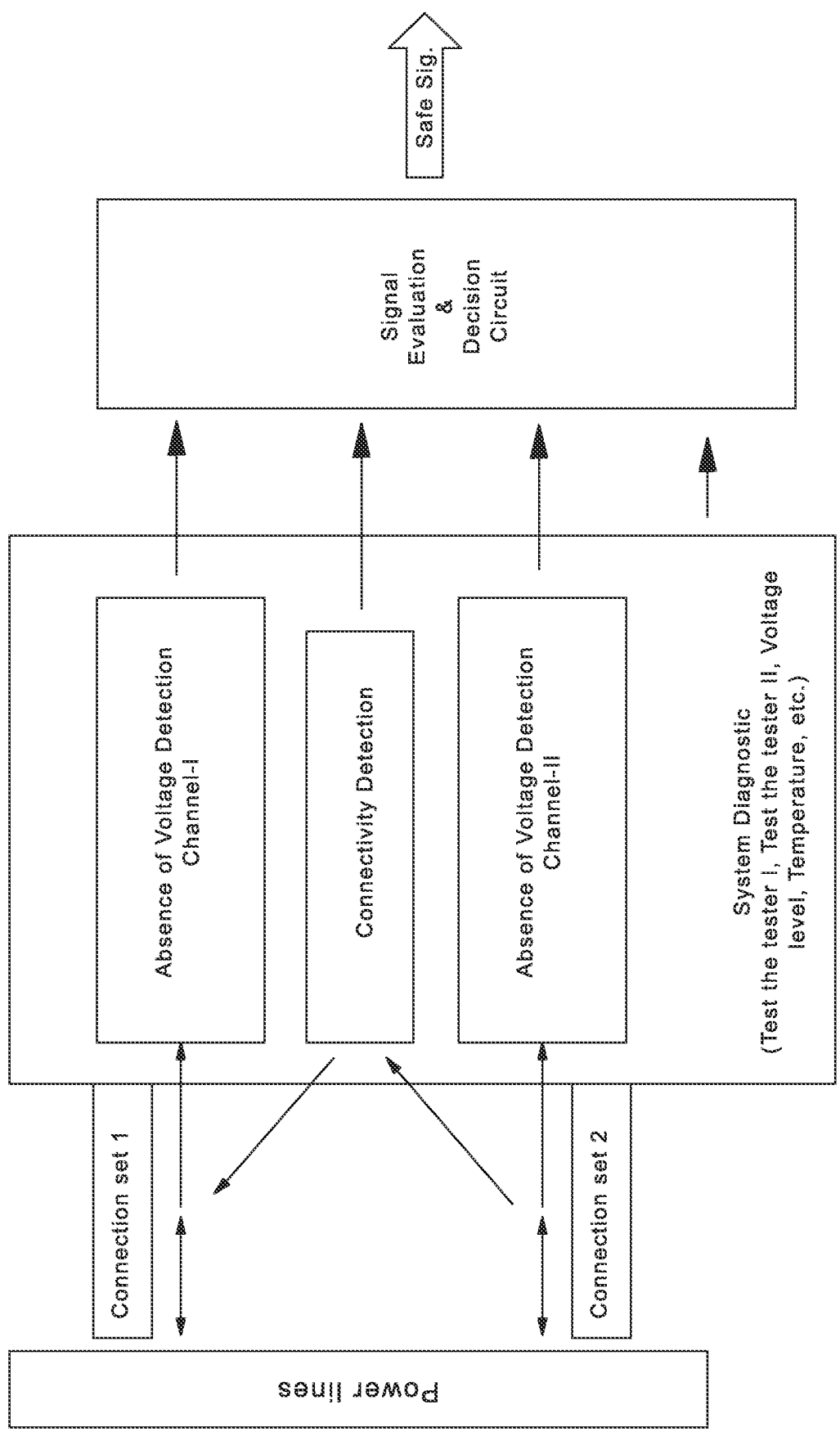
FIG. 15 is a block diagram showing the redundant channels of the absence of voltage detector of FIG. 1

AVD-II is a redundant Channel to AVD-I. Both AVD-I and AVD-II run in parallel, resulting in two independent decision outcomes. The outcomes are then ANDed together. The final decision results in a Safe-State only and only if both Channels produced the same outcome. Otherwise, a Fail-Safe state will be reported due to the discrepancy in the decision outcomes. FIG. 15 illustrates the AVD redundant Channels and their functional independency.

System Self-diagnostic Circuit II

The Self-Diagnostic Circuit II is a redundant Channel to Self-Diagnostic Circuit I dedicated for AVD-II circuit. This allows double verification and validation of all system critical elements and helps adding even more confidence in the functionality of the system and validity of the results.

Connectivity Detector

Connectivity detection is another verification step implemented into the design to validate and confirm that the installed AVD system is directly coupled as intended with direct connection to the device being monitored, and thus ensuring that that the device installation is intact—the AVD is measuring the actual voltage on the power lines and has not registered a no-voltage condition due to unknowingly disconnection error or installation failure such that the leads for each phase are shorted together and left tingling. In industrial electrical equipment, installation failure is typically a loose or severed connection due to a faulty termination, thermal expansion, or vibration. Verifying that connectivity between the leads of the AVD system and the circuit conductors existence can be accomplished by verifying that there is continuity throughout the system from the AVD to the main power lines.

Figure 16:
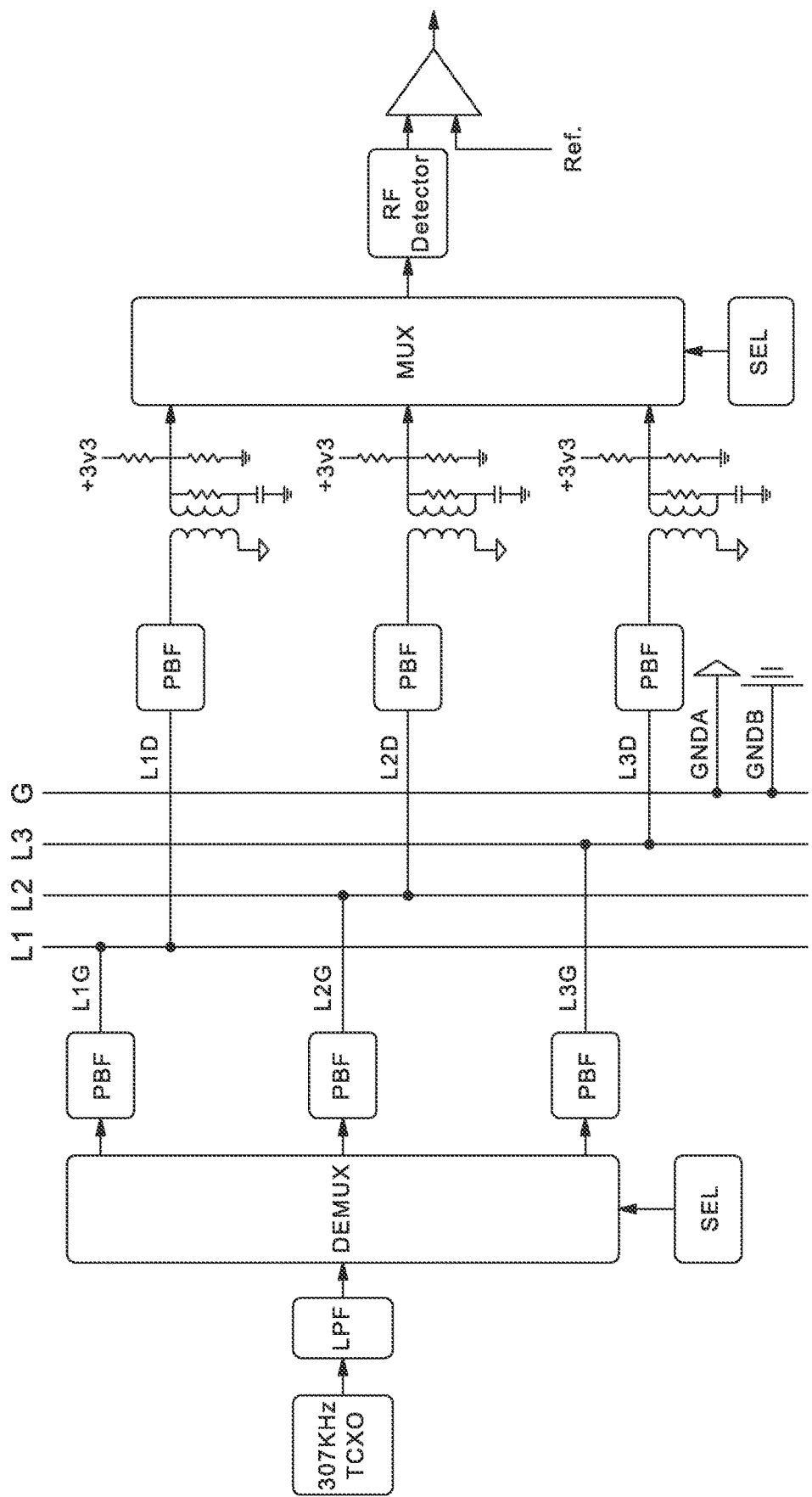
FIG. 16 shows the connectivity system architecture of the absence of voltage detector of FIG. 1.

FIG. 16 depicts a novel design concept for connectivity detection (CD). The CD circuit is mainly constructed of three parts; 1) RF signal generator, 2) RF Signal Detector, and 3) Logic Sequencer. The CD circuit aims at verifying the continuity between two wires that belong to the same phase. The wires are physically separate on the CD circuit and connect to the same terminal (i.e., Phase) on the power lines side. Each phase will require two wires; a three-phase system requires six wires in addition to two wires for safety ground. One wire from each phase connects to 307 KHz RF generation circuit throughout 6-Pole LC resonance filter that is constructed from two signal inductors and two X1Y1 capacitors in series. The X1Y1 capacitors are rated at 760 VAC/1500 VDC and form capacitive coupling with 8 KV enforced isolation between primary (i.e., power lines) and secondary (i.e., CD) circuits. An analog demultiplexer was employed to sequence the generated frequency on all three wires connect to power lines. The other wires from each phase connects to a frequency detector through another 6-Pole LC resonance filter that was also constructed from two signal inductors and two X1Y1 capacitors in series. This represents the return RF signal from the connection at power line terminal. The signal connects to the primary side of a coupling transformer. The transformer's secondary side connects to an analog multiplexer through RC biasing voltage networks. An RF envelop detector is utilized to detect signal amplitude which will be compared in the next stage to a pre-defined reference threshold. Only when the two wires belong to the same phase are connected at the power line terminal, the detected signal amplitude will be above the reference threshold. The first safety ground wire connects to the coupling transformer's primary. The other wire connects to the secondary side. In case any of the ground wires was disconnected, there would be no RF coupling between the transformer primary and secondary circuit and the CD procedure will fail connectivity verification.

Figure 17:
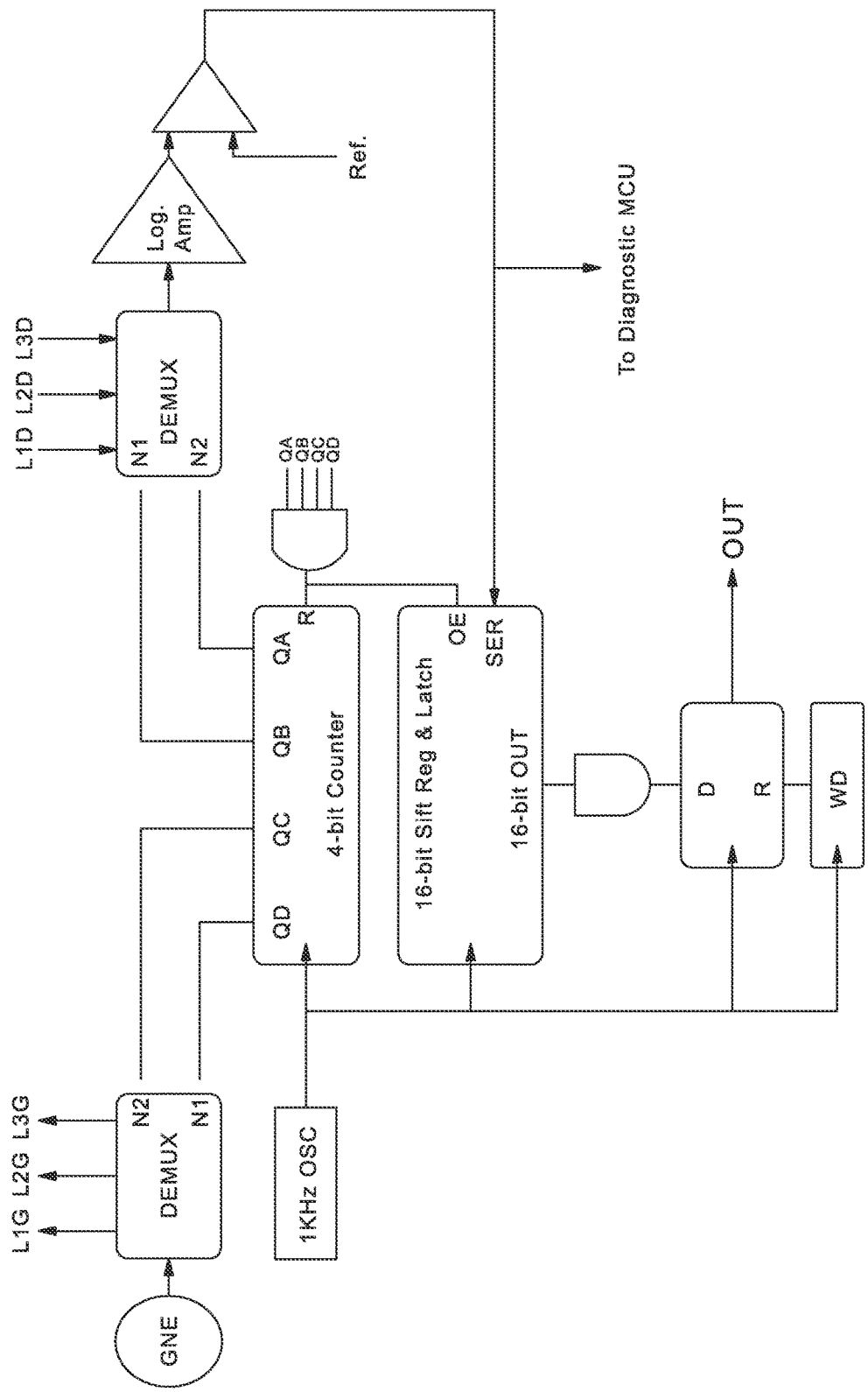
FIG. 17 shows the test sequencer of the connectivity system architecture of FIG. 16.

FIG. 17 illustrates the logic sequencer block diagram. The truth table for the tests sequence and expected outcome is shown on FIG. 18. The CD tests sequence procedure starts with verifying if there are any unwanted signals that have similar frequency component to the one generated by the CD RF generator (See Cnt-Out 0-4 on FIG. 18). The procedure verifies next if any of the wires belong to the same phase were swapped with the wire from other phases. The CD test will pass if and only if the 307 KHz RF signal detected when Cnt-Out =5, 10, and 15.

System Diagnostic Controller

Figure 19:
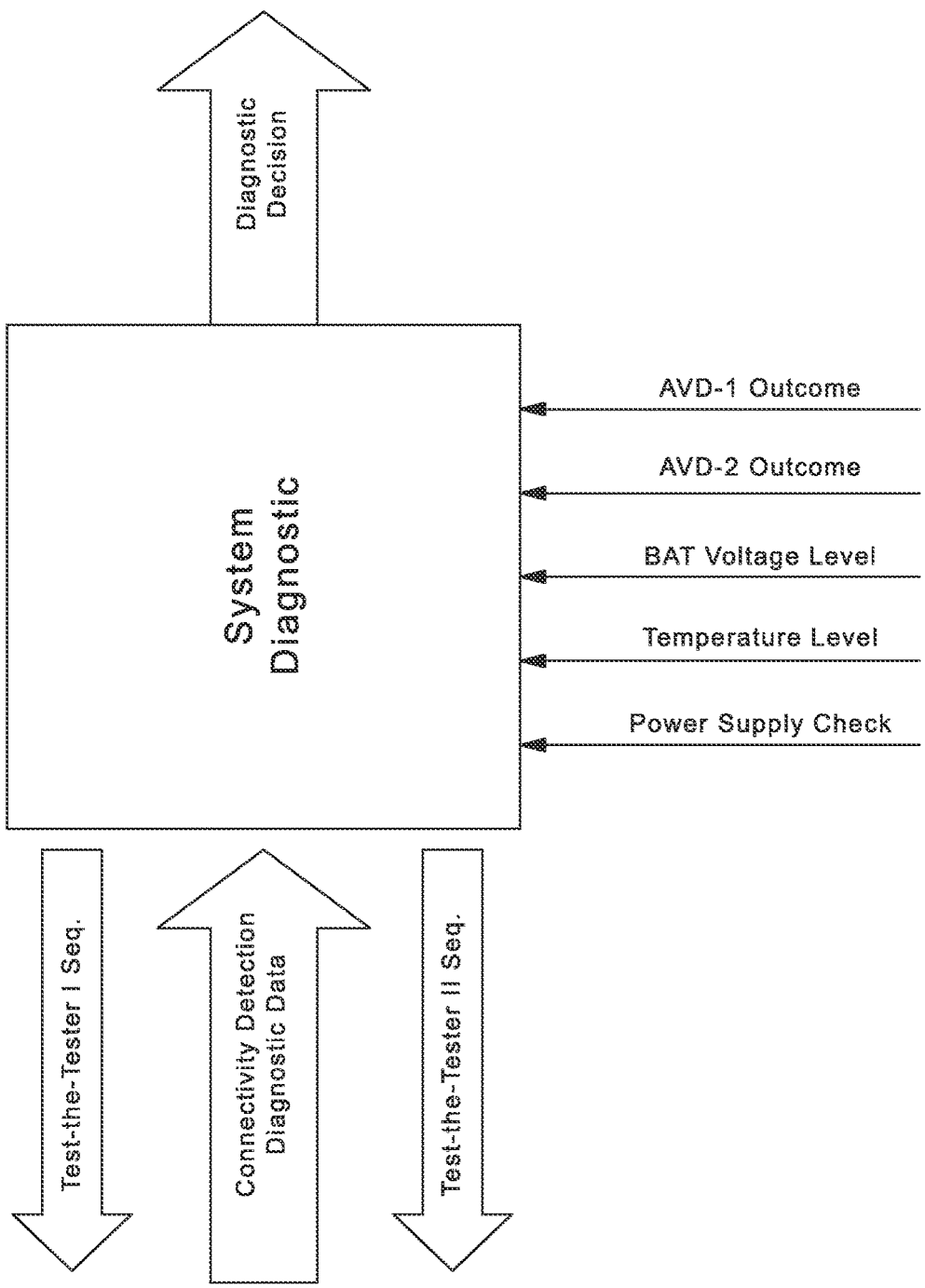
FIG. 19 is a block diagram of the system diagnostic controller.

The Diagnostic Controller (DMCU) is responsible for generating the sequence order for the self diagnostic circuit or Test-the-Tester. The DMCU has no control or effect on the functions or decision outcomes of ADV-I, AVD-2, and CD sub-system. It only reads the self-diagnostic procedure outcomes to generate a "diagnostic decision" that adds another verification level to the safe-state indication. Additionally, DMCU verifies the secondary source supply (voltage level) and operation temperature. FIG. 19 illustrates an overview of the DMCU inputs and outputs.

Signal Evaluation and Decision Circuit

Figure 20:
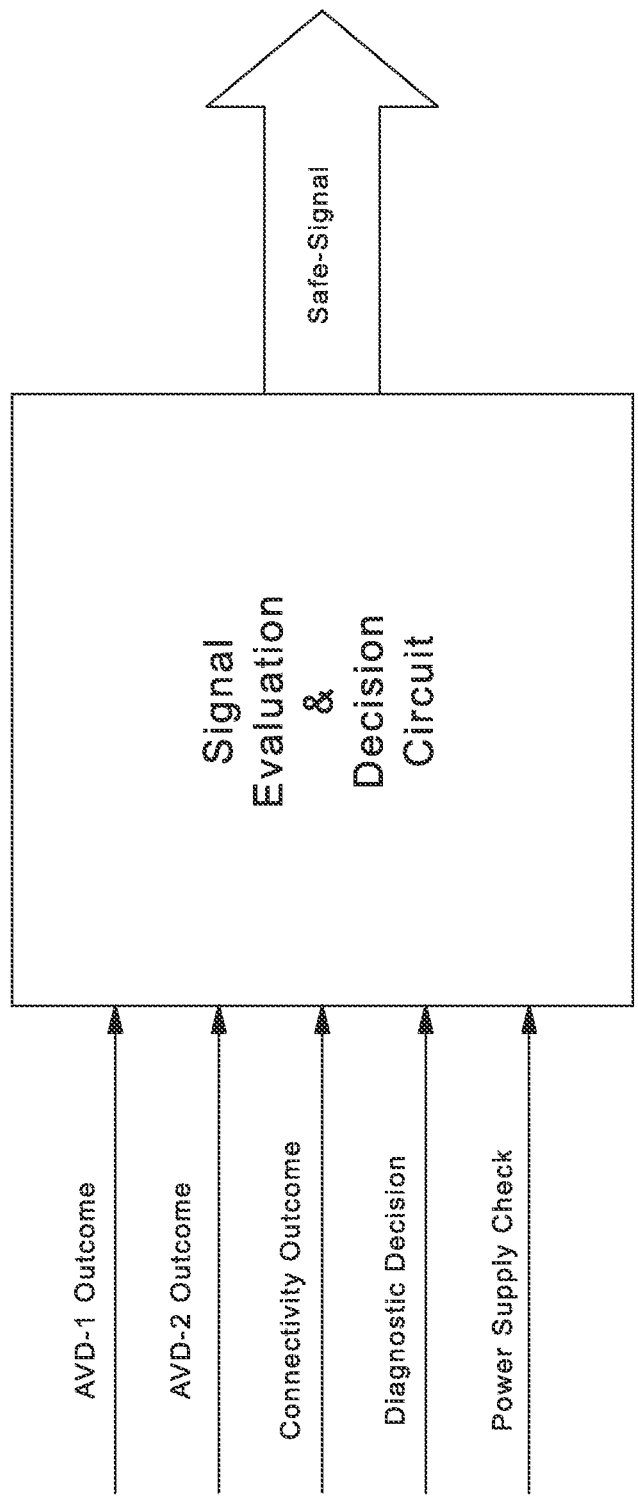
FIG. 20 is a block diagram of the signal evaluation decision circuit.

The signal evaluation was constructed using 5 PMOS transistors in cascade design. Each transistor is driven by one signal generated by one of the five sub-systems as illustrated in FIG. 20. The Safe-Signal output will be active If and only If all five signals have a logic 'LOW'. Meaning, the AVD for both channels was verified, the connectivity was verified, the self-diagnostic for both channels was verified, and the power supply check for all power sources was verified.

The invention claimed is:
1. A method for detecting the absence of voltage using an absence of voltage detection device comprising:
   initiation of a sequence by the user;
   checking a battery of the absence of voltage detection device;
   checking for a safe voltage threshold;
   checking a sequencer and oscillator of the absence of voltage detection device;
   performing a connectivity test via an RF generator connected with two leads per phase to a power source to be measured but one lead per phase to the RF generator;
   performing a voltage measurement test; and
   repeating the sequence of steps above.

* * * * *